(12) United States Patent
Choi (10) Patent No.: US 7,177,209 B2
(45) Date of Patent: Feb. 13, 2007

(54) SEMICONDUCTOR MEMORY DEVICE AND METHOD OF DRIVING THE SAME

(75) Inventor: Byoung Jin Choi, Icheon-Shi (KR)

(73) Assignee: Hynix Semiconductor Inc., Kyungki-do (KR)

(*) Notice: Subject to any disclaimer, the term of this patent is extended or adjusted under 35 U.S.C. 154(b) by 34 days.

(21) Appl. No.: 10/879,552

(22) Filed: Jun. 29, 2004

(65) Prior Publication Data

US 2005/0232036 A1   Oct. 20, 2005

(30) Foreign Application Priority Data

Apr. 20, 2004   (KR) .................. 10-2004-0027110

(51) Int. Cl.
*G11C 29/00* (2006.01)
*G11C 7/00* (2006.01)

(52) U.S. Cl. .................. 365/200; 365/201; 365/230.03

(58) Field of Classification Search .................. 365/200
See application file for complete search history.

(56) References Cited

U.S. PATENT DOCUMENTS 4,918,662 A * 4/1990 Kondo .................. 365/210
5,907,515 A * 5/1999 Hatakeyama .................. 365/200
6,646,932 B2 * 11/2003 Kato et al. .................. 365/200

FOREIGN PATENT DOCUMENTS

JP   11-178188   7/1999
KR   1997-51414   7/1997

* cited by examiner

*Primary Examiner*—Amir Zarabian
*Assistant Examiner*—Kretelia Graham
(74) *Attorney, Agent, or Firm*—Marshall, Gerstein & Borun LLP (57) ABSTRACT

Provided is directed to a semiconductor memory device and a method of driving the same capable of improving a repair efficiency with comparison to the conventional method which repairs all the redundancy row even when a defective cell is occurred in only one cell, by including: a memory cell array which is comprised of at least more than one redundancy block and redundancy segment by means of dividing it into a plurality of blocks toward a row direction and then dividing the blocks into a plurality of segments; a control circuit for storing a repair information of a defective cell and for repairing the segment generating the defective cell to the redundancy segment according to the repair information by inputting a row address signal and a column address signal.

19 Claims, 4 Drawing Sheets

SEMICONDUCTOR MEMORY DEVICE AND METHOD OF DRIVING THE SAME

This application relies for priority upon Korean Patent Application No. 2004-0027110 filed on Apr. 20, 2004, the contents of which are herein incorporated by reference in their entirety.

BACKGROUND

1. Field of the Invention

The present invention relates to a semiconductor memory device and a method of driving the same, and more particularly to, a semiconductor memory device and a method of driving the same which can improve repair efficiency by dividing a memory cell array into a plurality of blocks and segments, and repairing only a segment in which a defective cell is occurred to a redundancy segment.

2. Discussion of Related Art

A semiconductor memory device generally has a row and a column. That is, as having a plurality of memory cells arranged into a matrix form, the semiconductor memory device becomes an ultra-high integrated semiconductor memory device which has much more memory cells by increasing of a memory capacity. On the other hand, the semiconductor memory device gets defective memory cells by various reasons such as its own defect of a semiconductor substrate, a defect of design layout, a defect generated during processing, and so on. Accordingly, for improving a yield to use the semiconductor memory device even though there is a defective memory cell occurred therein, there is a method introduced that the defective memory cell is repaired with a redundancy cell by comprising the redundancy cell in a row and a column in a memory cell array.

A repairing method of a defective memory cell in the conventional art repairs a row block with a defective cell to a redundancy row block, regardless of the number of defective cells. That is, this repairing method repairs the row block with the defective memory cell to the redundancy row block even when one bit defect is occurred in a specific row block. Accordingly, when one bit defect is generated in the redundancy cell, the conventional repairing method can not use the whole of the one redundancy row block.

SUMMARY

The present invention is directed to a semiconductor memory device which can improve repair efficiency by including a memory cell array by means of dividing it into a plurality of blocks toward a row direction and then dividing one block into a plurality of segments, and repairing only a segment in which a defective cell is occurred to a redundancy segment.

One aspect of the present invention is to provide a driving method of the semiconductor memory device which can improve repair efficiency by including a memory cell array by means of dividing it into a plurality of blocks toward a row direction and then dividing one block into a plurality of segments, and repairing only a segment in which a defective cell is occurred to a redundancy segment.

Here, the semiconductor memory device according to an embodiment of the present invention includes: a memory cell array which is divided into a plurality of blocks toward a row direction, divides the blocks into a plurality of segments, and then is comprised of at least more than one redundancy block and one redundancy segment; a control circuit for storing an information of repair of a defective cell, and repairing the segment in which the defective cell is occurred to the redundancy segment according to the information of repair, by inputting a row address signal and a column address signal.

The control circuit includes: a block selecting circuit for outputting a block select signal to select a predetermined row block according to the row address signal; a fuse circuit for storing an information of a repair row block and a repair segment, and outputting a row repair signal to select the repair block and a column select signal to select the repair segment according to the result of comparing the row address signal and the column address signal with the information of the repair block and the repair segment, respectively; an enable circuit for outputting an enable signal to enable a normal block or a redundancy block by a logic combination of the block select signal and the row repair signal; a row decoder circuit for enabling a predetermined word line of the normal block by decoding the block select signal and the row address signal; a redundancy row decoder circuit for enabling a predetermined word line of the repair block according to the row repair signal; a sense amplifier control circuit for controlling a sense amplifier to sense a data of a memory cell which is selected by the block enable signal; and a connection circuit for accessing a normal cell or a redundancy cell by connecting a segment input/output line with a local input/output line according to the row repair signal, the block enable signal, the column select signal, and a column select summationmation signal.

The fuse circuit includes: a plurality of fuse sets for including a plurality of programmable fuses, storing the information of the repair block and the repair segment, and outputting a segment row repair signal and a segment signal by inputting the row address signal and the column address signal; a first logic unit for outputting the row repair signal by a logic combination of the segment row repair signals which are outputted from the plurality of fuse sets; and a second logic unit for outputting the column select signal by a logic combination of the segment signals which are outputted from the plurality of fuse sets.

The first logic unit includes: a NOR gate for logically combining the plurality of segment row repair signals outputted from the plurality of fuse sets; and an inverter for outputting the row repair signal by inverting an output signal of the NOR gate.

The second logic unit includes: a NOR gate for logically combining the plurality of segment signals outputted from the plurality of fuse sets.

The fuse sets include: a row selecting fuse set for including the programmable fuses, storing the information of the repair address according to the programming states of the fuses, and deciding an output according to if the row address signal is identical to the information of the repair address; an inverter for outputting the row repair signal by inverting an output signal of the row selecting fuse set; a segment selecting fuse set for including the programmable fuses, storing the information of the repair segment according to the programming states of the fuses, and outputting an signal to select the repair segment according to the column address signal; and a NAND gate for outputting the segment signal to select the repair segment of the repair row block by logically combining an output signal of the row selecting fuse set and an output signal of the segment fuse set.

The enable circuit includes a NOR gate.

The column select summation signal is generated by a NOR gate for logically combining the plurality of column select signals by inputting them, and an inverter for inverting an output signal of the NOR gate.

The connection circuit accesses the normal cell of the normal block according to the block enable signal, while not accessing the normal cell of the normal block according to the column select summation signal. Further, the connection circuit accesses the redundancy cell of the redundancy segment according to the row repair signal and the column select signal.

The connection circuit includes: a first NOR gate for logically combining the block enable signal; a second NOR gate for logically combining an output signal of the first NOR gate and the column select summation signal; an inverter for inverting an output signal of the second NOR gate; a third NOR gate for logically combining the corresponding column select signal and the following column select signal; and a NAND gate for outputting a connect signal by logically combining an output signal of the inverter and an output signal of the third NOR gate.

In addition, a driving method for the semiconductor memory device according to an embodiment of the present invention comprises the steps of: dividing the memory cell array into a plurality of blocks toward the row direction, dividing the blocks into a plurality of segments, and comprising at least more than one redundancy block and one redundancy segment; storing the information of the repair row block and the repair segment for a defective cell of the memory cell array; comparing the row address signal and the column address signal with the information of the repair row block and the repair segment; accessing a predetermined cell of the normal block, if the row address signal isn't identical to the information of the repair row block according to the comparing result; accessing the normal block, while not accessing the redundancy block, if the row address signal is identical to the information of the repair row block but the column address signal isn't identical to the information of the repair segment, according to the comparing result; accessing the redundancy cell of the redundancy segment, if the row address signal is identical to the information of the repair row block, and also the column address signal is identical to the information of the repair segment, according to the comparing result.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Hereinafter, it will be described about embodiments of the present invention in more detail with reference to drawings.

Figure 1:
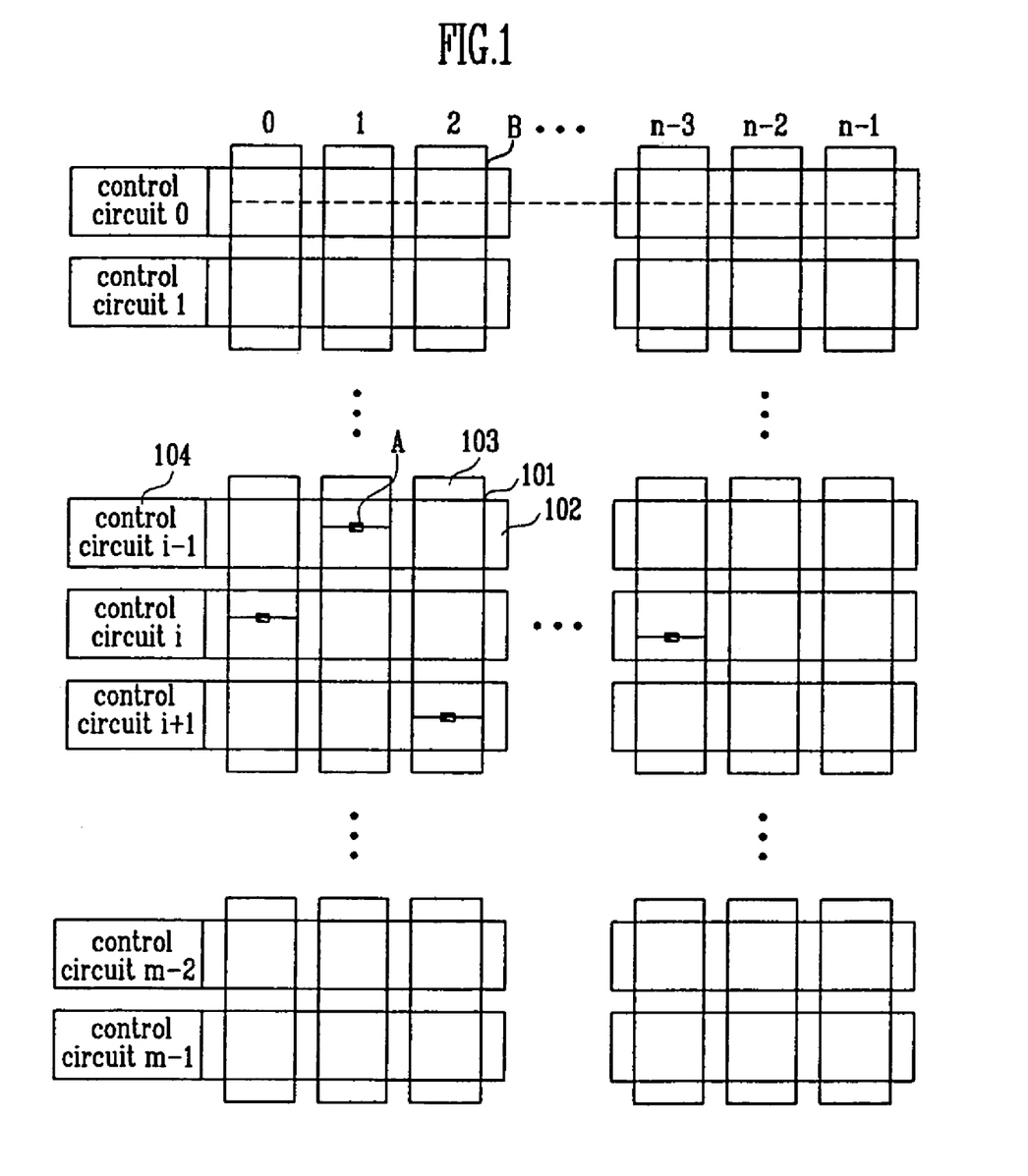
FIG. 1 is a structure diagram illustrating a segment row repairing method using a semiconductor memory device in accordance with the present invention.

FIG. 1 is a structure diagram of a semiconductor memory device possible for a segment row repair according to the present invention.

A memory cell array in accordance with the present invention is comprised by being divided into m-numbered of blocks toward a row direction and being divided one block into n-numbered of segments, and comprises more than one redundancy row block which is divided into at least n-numbered of segments. Accordingly, the memory cell array is divided into mXn-numbered of segments 101. Additionally, m+1-numbered of sense amplifiers 102 is arrayed for the m-numbered of blocks, n+1-numbered of sub-word line driver 103 is arrayed for the n-numbered of segments which divides one block, and a control circuit 104 is arrayed in the m-numbered of blocks, respectively. The segment row repair according to the present invention repairs a word line of a segment which is occurred a defective cell A to a word line of a redundancy segment B. A control circuit 104 shown in FIG. 2 is necessary to embody this segment row repair.

Figure 2:
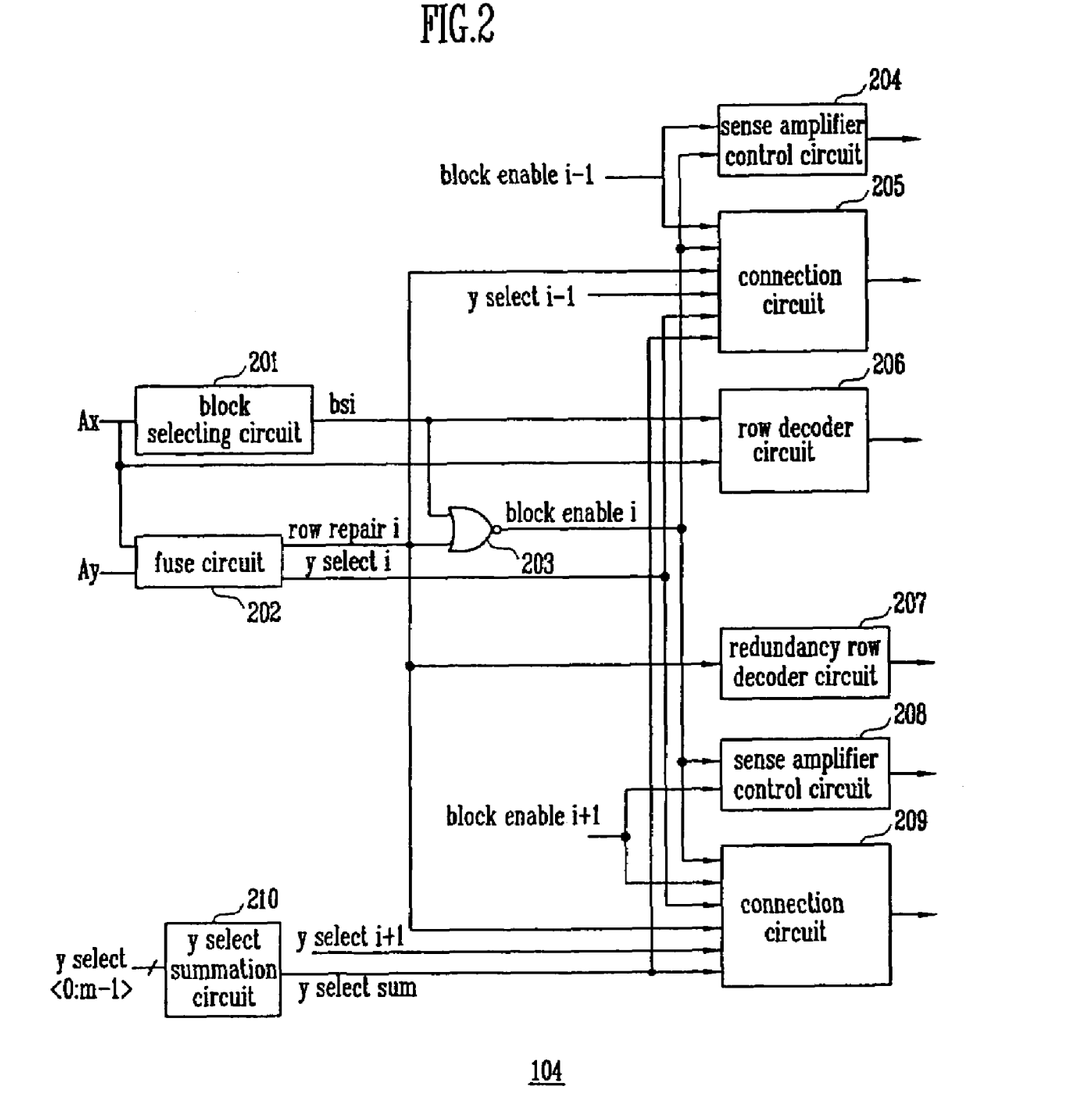
FIG. 2 is a structure diagram of a control circuit comprising the semiconductor memory device in accordance with an embodiment of the present invention.

FIG. 2 is a circuit diagram of a control circuit in accordance with the present invention. The control circuit is comprised of a block selecting circuit 201, a fuse circuit 202, an enable circuit 203, upper and lower sense amplifier control circuits 204 and 208, upper and lower connection circuits 205 and 209, a row decoder circuit 206, and a redundancy row decoder circuit 207.

The block selecting circuit 201 selects a predetermined block by outputting a block select signal bsi according to a row address signal Ax. The fuse circuit 202 is comprised by including a plurality of programmable fuses, and stores information of a repair and a segment according to the programming state, for instance, according to a fuse cutting state. This fuse circuit 202 outputs a row repair signal row repair i by distinguishing if the row address signal Ax is a repaired address or not by inputting the row address signal Ax, and also outputs a column select signal y select i by inputting a colunm address signal Ay. Here, the row repair signal row repair i is to select a repair block, while the column select signal y select i is to select a repair segment. The enable circuit 203 outputs a block enable signal block enable i which logically combines the block select signal bsi and the row repair signal the row repair i, for instance, to enable a selected block by comprising with a NOR gate. The enable circuit 203 enables a normal block which isn't repaired by the block select signal bsi, and enables the repair block by the row repair signal row repair i. The upper sense amplifier control circuit 204 outputs a signal to enable upper and lower sense amplifiers according to the corresponding block enable signal block enable i and the preceding block enable signal block enable i−1. The upper connection circuit 205 outputs a signal to connect a corresponding segment input/output line and a local input/output line according to the corresponding row repair signal row repair i, the corresponding block enable signal block enable i, the preceding block enable signal block enable i−1, the, corresponding column select signal y select i, the preceding column select signal y select i−1, and a column select summation signal y select summation received from a y select summation circuit 210. Here, the column select summation signal y select summation is generated by inputting a plurality of column select signals y select i and by logically combining them thereafter. The row decoder circuit 206 outputs a signal to enable a predetermined word line of a block which is selected by decoding the block select signal bsi and the row address signal Ax. The redundancy row decoder circuit 207 outputs a signal to enable a predetermined word line of the repair block selected by the row repair signal row repair i. The lower sense amplifier control circuit 208 outputs a signal to enable the lower sense amplifier according to the corresponding block enable signal block enable i and the following block enable signal block enable i+1. The lower connection circuit 209 outputs a signal to connect the corresponding segment input/output line with the local input/output line according to the row repair signal row repair i, the following row repair signal row repair i+1, the corresponding block enable signal block enable i, the following block enable signal block enable i+1, the corresponding column select signal y select i, the following column select signal y select i+1, and the column select summation signal y select summation.

It will now be explained about a driving method of the control circuit in accordance with the present invention constructed as the aforementioned.

When the row address signal Ax is inputted with a row address strobe RAS active command, the block selecting circuit 201 outputs the block select signal bsi to select a block by the row address signal Ax. On the other hand, the fuse circuit 202 inputting the row address signal Ax and the column address signal Ay distinguishes the row address signal Ax according to the repair information by the programming state, for instance, by a fuse cutout state, and then generates the row repair signal row repair i. Furthermore, the fuse circuit 202 distinguishes the column address signal Ay according to the segment information by the programming state, for instance, by a fuse cutout state, and then generates the column select signal y select i. Moreover, the enable circuit 203 outputs the block enable signal block enable i to enable a block which is selected in response of inputting the block select signal bsi and the row repair signal row repair i. Here, the enable circuit 203 enables the normal block by the block select signal bsi, while enables the repair block by the row repair signal row repair i. However, when the inputted row address signal Ax isn't the repair address, the redundancy row decoder circuit 207 is disabled and the row decoder circuit 206 inputting the block select signal bsi and the row address signal Ax decodes those signals, to enable a predetermined word line of the selected normal block. The upper and lower sense amplifier control circuits 204 and 208 enable a sense amplifier connected with a block which is selected by the corresponding block enable signal block enable i and the preceding and the following enable signals block enable i−1 and block enable i+1. Moreover, when a segment selected by the column address signal Ay which is inputted with a column access command isn't a repaired segment, the upper and lower connection circuits 205 and 209 of the normal segment which has the normal word line are driven. As a result, the information of the normal cell is outputted by connecting the segment input/output line sio with the local input/output line lio.

However, because the memory cell array is repaired by dividing into the n-numbered of segments, if a read or write command is inputted, the segment with a defective cell should be accessed to a redundancy cell of the redundancy segment, and the segment without repairing should be accessed to the normal cell. Accordingly, if the row address signal Ax which is inputted with the RAS active command is a repaired address, the row repair signal row repair i is outputted from the fuse circuit 202. According to this, the redundancy row decoder circuit 207 is enabled, to select a predetermined word line of the redundancy row block, and the row decoder circuit 206 inputting the block select signal bsi and the row address signal Ax decodes these signals, to enable a predetermined word line of the normal row block. As a result, the redundancy word line and the normal word line are being active at the same time. Also, the upper and lower sense amplifier control circuit 204 and 208 enable a sense amplifier which corresponds to a selected block according to the corresponding block enable signal block enable i and the preceding and the following block enable signals block enable i and the block enable i+1. As aforementioned, because the two word lines are being active at the same time, a data of the normal word line and a data of the redundancy word line are conflicted each other. According to this, the normal word line and the redundancy word line should not be in the same block or the adjacent block to avoid the conflict. That is, redundancy word lines of an i-th block and an i±1-th block should not be used to repair the word line of the i-th block. For this, in the condition that two word lines are being active, if the column address Ay which is inputted with the column access command is included in the repaired segment, the column select signal y select i is generated, to disable the connection circuits 205 and 209 of the block of which the normal word line is being active, and the column select signal y select i also enables the block connection circuits 205 and 209 of which the redundancy word line is being active, to access the redundancy cell of the redundancy segment.

Figure 3:
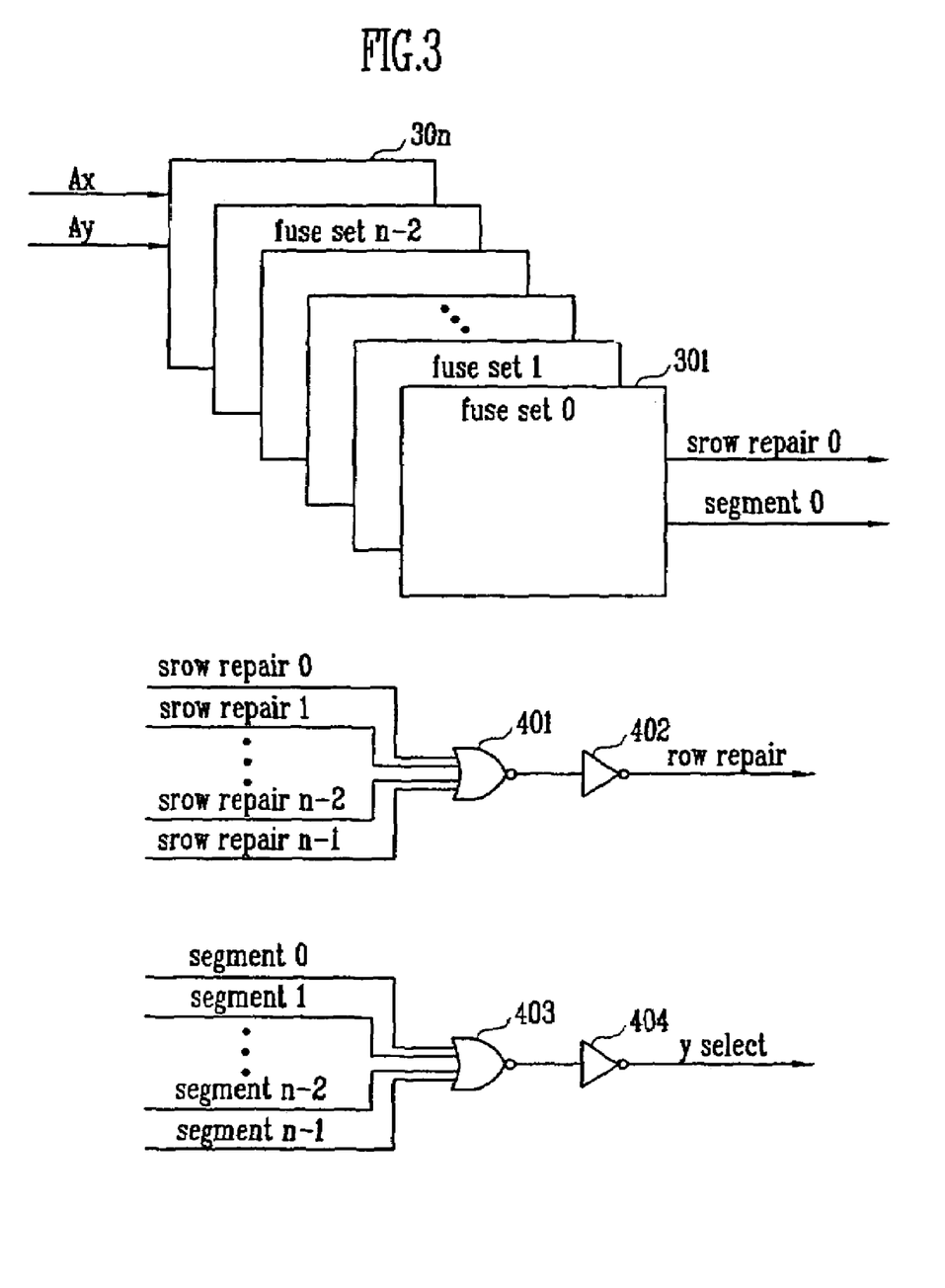
FIG. 3 is a circuit diagram of a fuse circuit in accordance with an embodiment of the present invention.

FIG. 3 is a structure diagram of the fuse circuit in accordance with an embodiment of the present invention.

Referring to FIG. 3, a plurality of fuse sets 301 to 30*n* inputs the row address signal Ax and the column address signal Ay, respectively, to output a segment row repair signal srow repair and a segment signal segment. A first NOR gate 401 and a first inverter 402 logically combine the segment row repair signal srow repair which is outputted from the plurality of fuse sets 301 to 30*n*, to output the row repair signal row repair. Furthermore, a second NOR gate 403 and a second inverter 404 logically combine the segment signal segment which is outputted from the plurality of fuse sets 301 to 30*n*, to output the column select signal y select.

Figure 4:
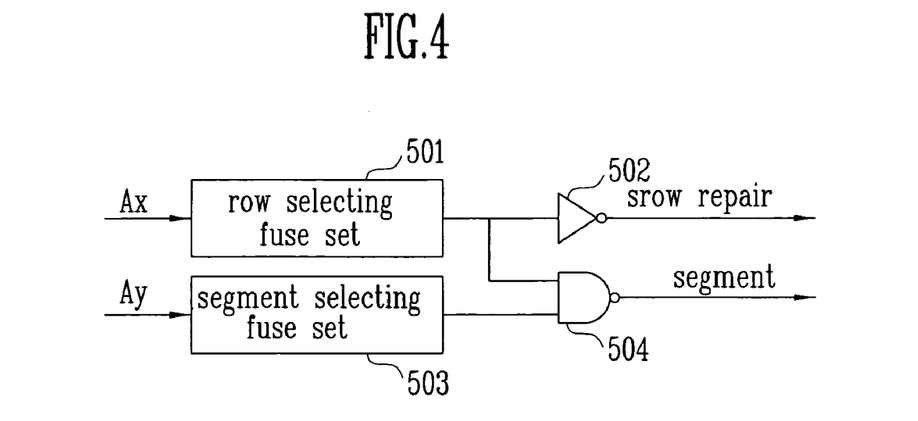
FIG. 4 is a circuit diagram of a fuse set in accordance with an embodiment of the present invention.

FIG. 4 is a structure diagram of fuse sets in accordance with an embodiment of the present invention.

Referring to FIG. 4, a row selecting fuse set 501, which is comprised by including fuses, stores the information of the repair address according to the fuse cutout state, and decides an output in accordance with if the inputted row address signal Ax is identical to the information of the repair address. An inverter 502 inverts the output signal of the row selecting fuse set 501, to output the segment row repair signal srow repair. A segment selecting fuse set 503, which is comprised by including fuses, stores the information of the segment according to the fuse cutout state, and outputs a signal to select a segment according to the inputted column address signal Ay. A NAND gate 504 logically combines an output signal of the row selecting fuse set 501 and an output signal of the segment fuse set 503, to output the segment signal segment to select the repair segment.

In the fuse circuit according to the embodiment of the present invention illustrated with reference to FIGS. 3 and 4, when the inputted row address signal Ax is the repair address stored in the row selecting fuse set 501 of the fuse sets 301 to 30*n*, the segment row repair signal srow repair, which is outputted from the fuse sets 301 to 30*n*, is outputted to high level. When at least one of the segment row repair signals srow repair is outputted to high level, the row repair signal row repair is outputted to high level. Moreover, when the inputted column address signal Ay is the repair segment address stored in the segment selecting fuse set 503 of the fuse sets 301 to 30*n*, the segment signal segment, which is outputted from the fuse sets 301 to 30n, is outputted to high level. When at least one of the segment signals segment is outputted to high level, the column select signal y select i is outputted to high level.

Figure 5:
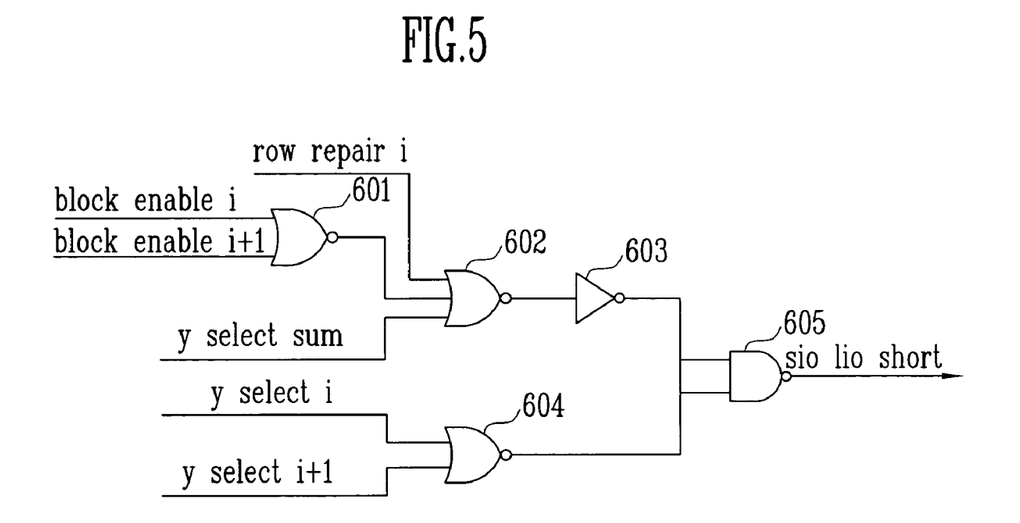
FIG. 5 is a circuit diagram of a connection circuit in accordance with an embodiment of the present invention.

FIG. 5 is a structure diagram of the connection circuit to connect the segment input/output line sio with the local input/output line lio in accordance with an embodiment of the present invention.

Referring to FIG. 5, a first NOR gate 601 logically combines the corresponding block enable signal block enable i and the following block enable signal block enable i+1. A second NOR gate 602 logically combines the corresponding row repair signal row repair i and the following row repair signal row repair i+1, and an output signal of the first NOR gate 601 and the column select summation signal y select summation. An inverter 603 inverts an output signal of the second NOR gate 602. A third NOR gate 604 logically combines the corresponding column select signal y select i and the following column select signal y select i+1. A NAND gate 605 logically combines an output signal of the inverter 603 and an output signal of the third NOR gate 604, to output a connect signal short.

It will now be described about a driving method of the connection circuit in accordance with the embodiment of the present invention constructed as the aforementioned If the memory cell of the normal block is selected, and the corresponding block enable signal block enable i is applied to high level to output the data by connecting the segment input/output line sio with the local input/output line lio, the first NOR gate 601 outputs a signal of low level, regardless of the level of the following block enable signal block enable i+1. During this, because of selecting the normal block, the row repair signal row repair i and the column select summation signal y select summation are all applied to low level. Accordingly, the second NOR gate 602 outputs a signal of high level. The signal is inverted to low level through the inverter 603. On the other side, because the column select signal y select i for selecting the repair segment is applied to low level, the third NOR gate 604 outputs a signal of high level. As a result, as the NAND gate 605 inputs an output signal of low level from the inverter 603 and an output signal of high level from the column select signal y select i and then outputs the connect signal short to high level, the selected cell data of the normal block is outputted through the segment input/output line sio and the local input/output line lio.

It will now be described about a driving method when the repair segment is generated by repairing the defective cell but the normal block is selected, as follows. The first NOR gate 601 outputs a signal of low level by the block enable signal block enable i which is applied to high level by selecting the normal block. While this, the column select summation signal y select summation is applied to high level because a segment is repaired. Accordingly, the second NOR gate 602 outputs a signal of low level, and the signal is inverted to high level by the inverter 603. On the other hand, because the column select signal y select i for selecting the repair segment is applied to low level, the third NOR gate 604 outputs a signal of high level. As a result, as the NAND gate 605 inputs an output signal of high level from the inverter 603 and an output signal of high level of the column select signal and then outputs the connect signal short of low level, the segment input/output line sio and the local input/output line lio are not connected.

It will now be explained about a driving method for outputting the data of the memory cell of the repair segment as follows. The first NOR gate 601 is outputted to high level by applying the block enable signal block enable i to low level because of selecting the repair segment. During this, the row repair signal row repair i and the column select summation signal y select summation are applied to high level. Accordingly, the second NOR gate 602 outputs a signal of low level and the signal is inverted to high level. The third NOR gate 604 outputs a signal of low level because the column select signal y select i for selecting the repair segment is applied to high level. Accordingly, as the NAND gate 605 inputs an output signal of low level from the inverter 603 and an output signal of the column select signal y select i of low level and then outputs the connect signal short of high level, the data of the memory cell of the repair segment is outputted through the segment input/output line sio and the local input/output line lio.

Figure 6:
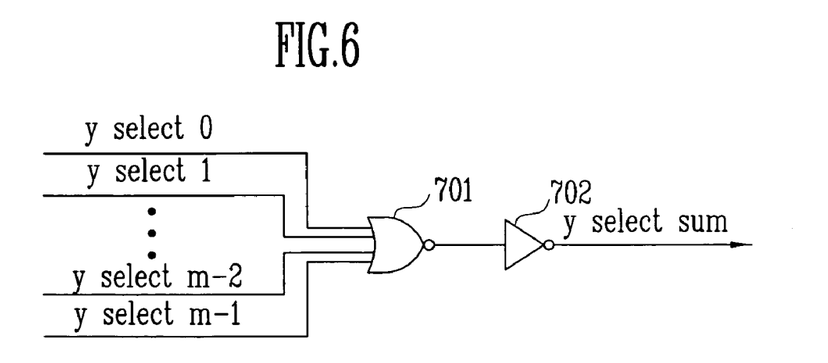
FIG. 6 is a circuit diagram of a y select summation circuit in accordance with an embodiment of the present invention.

FIG. 6 is a structure diagram of a y select summation circuit for generating the column select summation signal in accordance with an embodiment of the present invention. The circuit is comprised of: a NOR gate 701 for inputting a plurality of colunm select signals y select and then logically combining them; and an inverter 702 for outputting the column select summation signal y select summation by inverting an output signal of the NOR gate 702. Accordingly, when at least one column select signal y select for selecting the repair segment maintains high level, the column select summation signal also maintains high level.

As described earlier, the present invention can improve the repair efficiency more, after comprising the memory cell array by dividing into the m-numbered of blocks toward the row direction and then dividing one block into the n-numbered of segments, by repairing the segment, in which the defective cell is occurred, to the redundancy segment, comparing with the conventional method which repairs all the redundancy row block even when one defective cell is occurred. Accordingly, when one bit defect is occurred in the redundancy row block, it is impossible to use the whole redundancy row block with the conventional repair method. In the present invention, only the segment which has repaired the defective cell can not use, but other segments can use for the repair, which leads to improve the repair efficiency thereto.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A semiconductor memory device, comprising:
a memory cell array divided into a plurality of row blocks and a plurality of repair blocks toward a row direction, wherein the respective row blocks and the respective repair blocks are divided into a plurality of segments toward a column direction; and
a control circuit for storing a repair information of a defective cell and replacing a row segment of the row block including the defective cell with a repair segment of the repair block according to the repair information, by inputting a row address signal and a column address signal, the control circuit comprising:
a block selecting circuit for outputting a block select signal to select a predetermined row block according to the row address signal;
a fuse circuit for storing information of the repair block and the repair segment, and outputting a column select signal to select the repair segment and a row repair signal to select the repair block according to a result of comparing the row address signal and the column address signal with the information of the repair block and the repair segment;

an enable circuit for outputting a block enable signal to enable a normal block and a redundancy block by logically combining the block select signal and the row repair signal;

a row decoder circuit for enabling a predetermined word line of the normal block by decoding the block select signal and the row address signal;

a redundancy row decoder circuit for enabling a predetermined word line of the repair block according to the row repair signal;

a sense amplifier control circuit for controlling a sense amplifier to sense a data of a memory cell of a selected block according to the block enable signal; and a connection circuit for accessing a normal cell or a redundancy cell by connecting a segment input/output line with a local input/output line according to the row repair signal, the block enable signal, the column select signal and a column select summation signal.

2. The semiconductor memory device of claim 1, wherein the fuse circuit includes:

a plurality of fuse sets for storing the information of the repair block and the repair segment, wherein each of the plurality of fuse sets outputs a segment row repair signal and a segment signal by inputting the row address signal and the column address signal;

a first logic unit for outputting the row repair signal by logically combining the segment row repair signal which is outputted from the plurality of fuse sets; and a second logic unit for outputting the column select signal by logically combining the segment signal which is outputted from the plurality of fuse sets.

3. The semiconductor memory device of claim 2, wherein the first logic unit includes:

a NOR gate for logically combining the plurality of segment row repair signals outputted from the plurality of fuse sets; and an inverter for outputting the row repair signal by inverting an output signal of the NOR gate.

4. The semiconductor memory device of claim 2, wherein the second logic unit includes:

a NOR gate for logically combining the plurality of segment signals outputted from the plurality of fuse sets; and an inverter for outputting the column select signal by inverting an output signal of the NOR gate.

5. The semiconductor memory device of claim 2, wherein the plurality of fuse sets include:

a row selecting fuse set for storing an information of a repair address, and deciding an output in accordance with if the row address signal is identical to the information of the repair address;

an inverter for outputting the segment row repair signal by inverting an output signal of the row selecting fuse set;

a segment selecting fuse set for storing an information of the repair segment, and outputting a signal to select the repair segment in accordance with the colunm address signal; and a NAND gate for outputting the segment signal to select the repair segment of the repair block by logically combining an output signal of the row selecting fuse set and an output signal of the segment selecting fuse set.

6. The semiconductor memory device of claim 1, wherein the enable circuit includes a NOR gate.

7. The semiconductor memory device of claim 1, wherein the column select summation signal is generated by a y select summation circuit, the y select summation circuit includes:

a NOR gate for receiving a plurality of column select signals and then logically combining them; and an inverter for inverting an output signal of the NOR gate and then outputting the column select summation signal.

8. The semiconductor memory device of claim 1, wherein the connection circuit accesses the normal cell of the normal block according to the block enable signal, doesn't access the normal cell of the normal block according to the column select summation signal, and accesses the redundancy cell of a redundancy segment according to the row repair signal and the column select signal.

9. The semiconductor memory device of claim 1, wherein the connection circuit includes:

a first NOR gate for logically combining the block enable signal;

a second NOR gate for logically combining an output signal of the first NOR gate and the column select summation signal;

an inverter for inverting an output signal of the second NOR gate;

a third NOR gate for logically combining the column select signal and a following column select signal; and a NAND gate for outputting a connect signal by logically combining an output signal of the inverter and an output signal of the third NOR gate.

10. A method of driving the semiconductor memory device, comprising the steps of:

dividing a memory cell array into a plurality of row blocks and a plurality of repair blocks toward a row direction and dividing the respective row blocks and the respective repair blocks into a plurality of segments toward a column direction;

storing information of a repair block and a repair segment to replace a row segment of a row block including a defective cell;

comparing a row address signal and a column address signal with the information of the repair block and the repair segment to provide a comparing result;

accessing a predetermined cell of a normal block, if the row address signal isn't identical to the information of the repair block according to the comparing result;

accessing the normal block, while not accessing a redundancy block, if the row address signal is identical to the information of the repair block but the column address signal isn't identical to the information of the repair segment according to the comparing result; and accessing a redundancy segment instead of a row redundant segment including the defective cell, if the row address signal is identical to the information of the repair block and also the column address signal is identical to the information of the repair segment.

11. A semiconductor memory device, comprising:

a memory cell array comprised of at least more than one redundancy block and redundancy segment by dividing it into a plurality of blocks toward a row direction and also dividing the blocks into a plurality of segments; and a control circuit for storing a repair information of a defective cell and repairing a segment in which the defective cell is occurred to the redundancy segment according to the repair information, by inputting a row address signal and a column address signal, the control circuit comprising:
- a block selecting circuit for outputting a block select signal to select a predetermined row block according to the row address signal;
- a fuse circuit for storing information of a repair block or a repair segment, and outputting a column select signal to select the repair segment and a row repair signal to select the repair block according to a result of comparing the row address signal and the column address signal with the information of the repair block and the repair segment;
- an enable circuit for outputting a block enable signal to enable a normal block and a redundancy block by logically combining the block select signal and the row repair signal;
- a row decoder circuit for enabling a predetermined word line of the normal block by decoding the block select signal and the row address signal;
- a redundancy row decoder circuit for enabling a predetermined word line of the repair block according to the row repair signal;
- a sense amplifier control circuit for controlling a sense amplifier to sense a data of a memory cell of a selected block according to the block enable signal; and
- a connection circuit for accessing a normal cell or a redundancy cell by connecting a segment input/output line with a local input/output line according to the row repair signal, the block enable signal, the colunm select signal and a column select summation signal.

12. The semiconductor memory device of claim 11, wherein the fuse circuit includes:
- a plurality of fuse sets for storing the information of the repair block and the repair segment, wherein each of the plurality of fuse sets outputs a segment row repair signal and a segment signal, respectively, by inputting the row address signal and the column address signal;
- a first logic unit for outputting the row repair signal by logically combining the segment row repair signal which is outputted from the plurality of fuse sets; and
- a second logic unit for outputting the column select signal by logically combining the segment signal which is outputted from the plurality of fuse sets.

13. The semiconductor memory device of claim 12, wherein the first logic unit includes:
- a NOR gate for logically combining the plurality of segment row repair signals outputted from the plurality of fuse sets; and
- an inverter for outputting the row repair signal by inverting an output signal of the NOR gate.

14. The semiconductor memory device of claim 12, wherein the second logic unit includes:
- a NOR gate for logically combining the plurality of segment signals outputted from the plurality of fuse sets; and
- an inverter for outputting the column select signal by inverting an output signal of the NOR gate.

15. The semiconductor memory device of claim 12, wherein the plurality of fuse sets include:
- a row selecting fuse set for storing an information of a repair address and deciding an output in accordance with if the row address signal is identical to the information of the repair address;
- a segment selecting fuse set for storing an information of the repair segment, and outputting a signal to select the repair segment in accordance with the column address signal; and
- a NAND gate for outputting the segment signal to select the repair segment of the repair block by logically combining an output signal of the row selecting fuse set and an output signal of the segment selecting fuse set.

16. The semiconductor memory device of claim 11, wherein the enable circuit includes a NOR gate.

17. The semiconductor memory device of claim 11, wherein the column select summation signal is generated by a NOR gate to input and then logically combine a plurality of column select signals, and by an inverter to invert an output signal of the NOR gate.

18. The semiconductor memory device of claim 11, wherein the connection circuit accesses the normal cell of the normal block according to the block enable signal, doesn't access the normal cell of the normal block according to the colunm select summation signal, and accesses the redundancy cell of the redundancy segment according to the row repair signal and the column select signal.

19. The semiconductor memory device of claim 11, wherein the connection circuit includes:
- a first NOR gate for logically combining the block enable signal;
- a second NOR gate for logically combining an output signal of the first NOR gate and the column select summation signal;
- an inverter for inverting an output signal of the second NOR gate;
- a third NOR gate for logically combining the column select signal and a following column select signal; and
- a NAND gate for outputting a connect signal by logically combining an output signal of the inverter and an output signal of the third NOR gate.

* * * * *